United States Patent
Lin

(10) Patent No.: US 10,680,584 B2
(45) Date of Patent: Jun. 9, 2020

(54) LEVEL SHIFTING CIRCUIT AND METHOD FOR OPERATING A LEVEL SHIFTER

(71) Applicant: eMemory Technology Inc., Hsin-Chu (TW)

(72) Inventor: Huan-Min Lin, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 16/522,613

(22) Filed: Jul. 25, 2019

(65) Prior Publication Data

US 2020/0091896 A1   Mar. 19, 2020

Related U.S. Application Data

(60) Provisional application No. 62/733,089, filed on Sep. 19, 2018.

(51) Int. Cl.
| | |
|---|---|
| *H03K 3/00* | (2006.01) |
| *H03K 3/012* | (2006.01) |
| *H03K 19/0185* | (2006.01) |
| *H03K 19/20* | (2006.01) |
| *H03K 3/037* | (2006.01) |

(52) U.S. Cl.
CPC ............. *H03K 3/012* (2013.01); *H03K 3/037* (2013.01); *H03K 19/018521* (2013.01); *H03K 19/20* (2013.01)

(58) Field of Classification Search
CPC ........... H03K 19/018521; H03K 19/20; H03K 19/00315; H03K 19/018535; H03K 19/018528; H03K 3/356113; H03K 3/012; H03K 3/037; G11C 8/08
See application file for complete search history.

(56) References Cited

U.S. PATENT DOCUMENTS

| | | | |
|---|---|---|---|
| 4,618,785 A | 10/1986 | Van Tran | |
| 5,306,970 A * | 4/1994 | Phillips | ................. G11C 7/062 327/208 |
| 6,995,598 B2 | 2/2006 | Hochschild | |
| 7,710,183 B2 | 5/2010 | Chaba | |
| 8,653,877 B2 | 2/2014 | Wu | |
| 2007/0164789 A1* | 7/2007 | Panjwani | ....... H03K 19/018528 326/80 |

FOREIGN PATENT DOCUMENTS

| | | |
|---|---|---|
| TW | I264871 | 10/2006 |
| TW | I350055 | 10/2011 |
| TW | I497914 B | 8/2015 |
| TW | M539742 U | 4/2017 |

* cited by examiner

*Primary Examiner* — Long Nguyen
(74) *Attorney, Agent, or Firm* — Winston Hsu

(57) ABSTRACT

A level shifting circuit generates a pulse signal, when both of the logic levels of two complementary input signals of a level shifter has changed while both of the logic levels of two output signals of the level shifter present at low logic level, to pull up either one of the output signals of the level shifter to a second high logic level. Once the logic level of both output signals at the first output node and the second output node present complementary, the level shifting circuit stops pulling up the output signal.

12 Claims, 4 Drawing Sheets

LEVEL SHIFTING CIRCUIT AND METHOD FOR OPERATING A LEVEL SHIFTER

CROSS REFERENCE TO RELATED APPLICATIONS

This application claims the benefit of U.S. Provisional Application No. 62/733,089, filed on Sep. 19, 2018, the entirety of which is incorporated by reference herein.

BACKGROUND OF THE INVENTION

1. Field of the Invention

The present disclosure relates to a level shifting circuit, and a method for operating a level shifter. More specifically, the present disclosure relates to a level shifting circuit and a method for operating a level shifter that balance the transition speed at two sides of the level shifter.

2. Description of the Prior Art

Generally, level shifters are used for shifting signals from one logic level to another. The conventional level shifter is composed of several NMOS transistors and PMOS transistors. Since the NMOS transistors are generally, by design, much stronger than the PMOS transistors, the time required for the PMOS transistors to shift from a low logic level to a high logic level is much longer than that of the NMOS transistors. Therefore, level shifters typically suffer from an unbalanced transition speed at two output terminals.

SUMMARY OF THE INVENTION

To solve at least the aforesaid problem, the present disclosure provides a level shifting circuit. The level shifting circuit may comprise a level shifter, a pulse generator coupled with the level shifter, and a pull-up circuit coupled with the level shifter and the pulse generator. The level shifter may comprise a first input node and a second input node for receiving complementary input signals that change between a first high logic level and a low logic level. The level shifter may also comprise first output node and a second output node (for outputting complementary signals that change between a second high logic level and the low logic level. The pulse generator may be configured to generate a pulse signal when each logic level of the complementary input signals has changed while both logic levels of the signals outputted from the first output node and the second output node are at the low logic level. The pull-up circuit may comprise a first pull-up device and a second pull-up device. In response to the pulse signal, either one of the first pull-up device and the second pull-up device is enabled, and the output signal on the output node corresponding to the enabled one of the first pull-up device and the second pull-up device is pulled up to the second high logic level. Once the logic level of both output signals at the first output node and the second output node present complementary, the enabled one of the first pull-up device and the second pull-up device is disabled.

To sum up, the level shifting circuit is proposed to pull up either one of the output signals of the first output node and the second output node of the level shifter in a faster way when each logic level of the input signal and the inverted input signal has been changed. As a result, the unbalanced transition speed at the two sides of the level shifter can be effectively improved.

The aforesaid content is not intended to limit the present invention, but merely provides preliminary profile of the present invention to people having ordinary skill in the art. People having ordinary skill in the art can understand the details of the present invention according to the attached drawings and the embodiments recited in the following detailed description.

These and other objectives of the present invention will no doubt become obvious to those of ordinary skill in the art after reading the following detailed description of the preferred embodiment that is illustrated in the various figures and drawings.

DETAILED DESCRIPTION

The embodiments described below are not intended to limit the invention to any specific environment, applications, structures, processes or steps described in these embodiments. In the attached drawings, elements unrelated to the present invention are omitted from depiction. Dimensions and dimensional relationships among individual elements in the attached drawings are only exemplary examples and are not intended to limit the present invention. Unless stated particularly, same (or similar) element numerals may correspond to same (or similar) elements in the following description.

The terminology used herein is for the purpose of describing the embodiments only and is not intended to limit the present invention. The singular forms "a" and "an" are intended to include the plural forms as well, unless the context clearly indicates otherwise. The terms "comprises," "comprising," "includes," "including," etc., specify the presence of the stated features, integers, steps, operations, elements, and/or components, but do not preclude the presence or addition of one or more other features, integers, steps, operations, elements, components, and/or groups thereof. The term "and/or" includes any and all combinations of one or more of the associated listed items. Although the terms "first," "second," "third," etc., may be used herein to describe various elements, these elements should not be limited by these terms. These terms are merely used to distinguish one element from another element. Thus, for example, a first element described below could also be termed a second element, without departing from the spirit and scope of the present invention.

Figure 1:
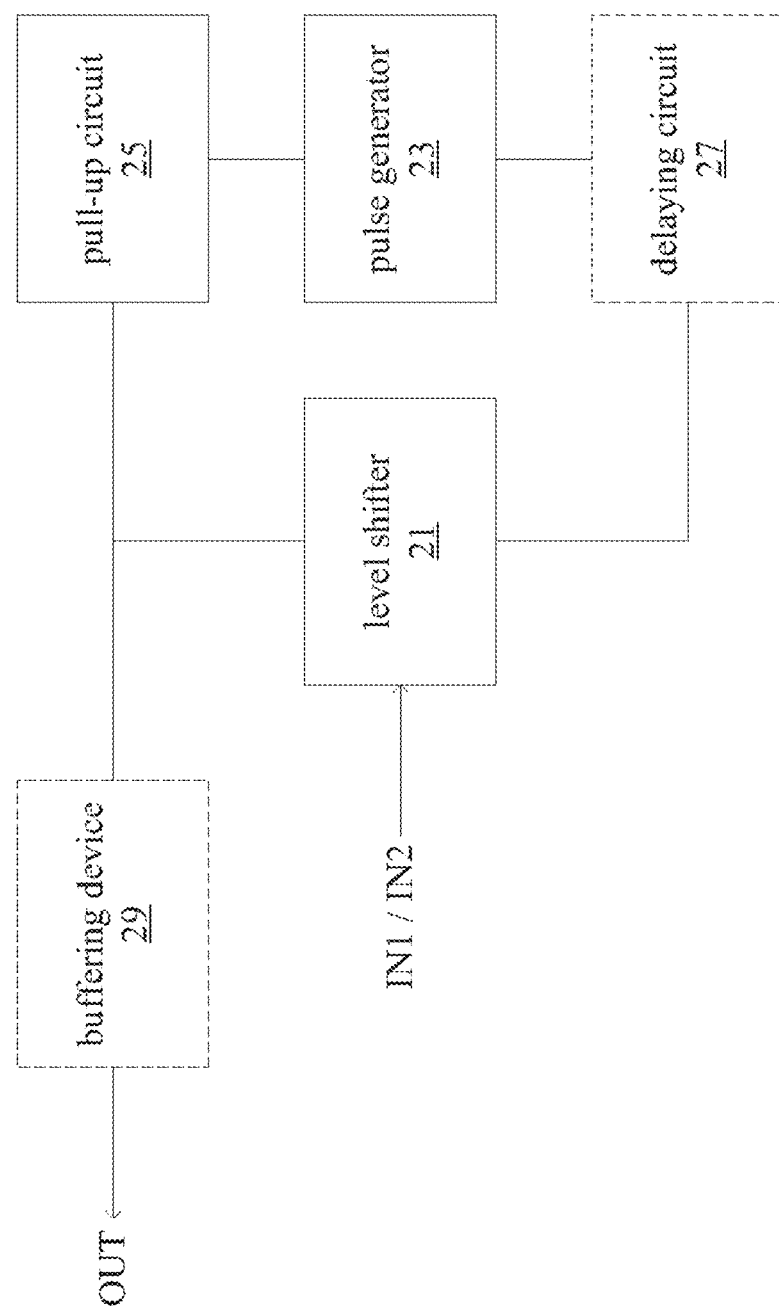
FIG. 1 illustrates a block diagram of a level shifting circuit according to one or more embodiments of the present invention.

FIG. 1 illustrates a block diagram of a level shifting circuit according to one or more embodiments of the present invention. The contents shown in FIG. 1 are merely for explaining the embodiments of the present invention instead of limiting the present invention.

Referring to FIG. 1, a level shifting circuit 1 may comprise a level shifter 21, a pulse generator 23 coupled with the level shifter 21 and a pull-up circuit 25 coupled with the pulse generator 23. In some embodiments, in addition to the pulse generator 23 and the pull-up circuit 25, the level shifting circuit 1 may further comprise a delaying circuit 27 coupled with the level shifter 21 and the pulse generator 23, and/or comprise a buffering device 29 coupled with the level shifter 21 and the pull-up circuit 25.

The pulse generator 23 may be configured to generate a pulse signal when each logic level of the input signal and the inverted input signal has been changed while both logic levels of the output signals are at a low logic level. The pull-up circuit 25 may be configured to, in response to the pulse signal, pull up either one of the output signals to a second high logic level.

Figure 2A:
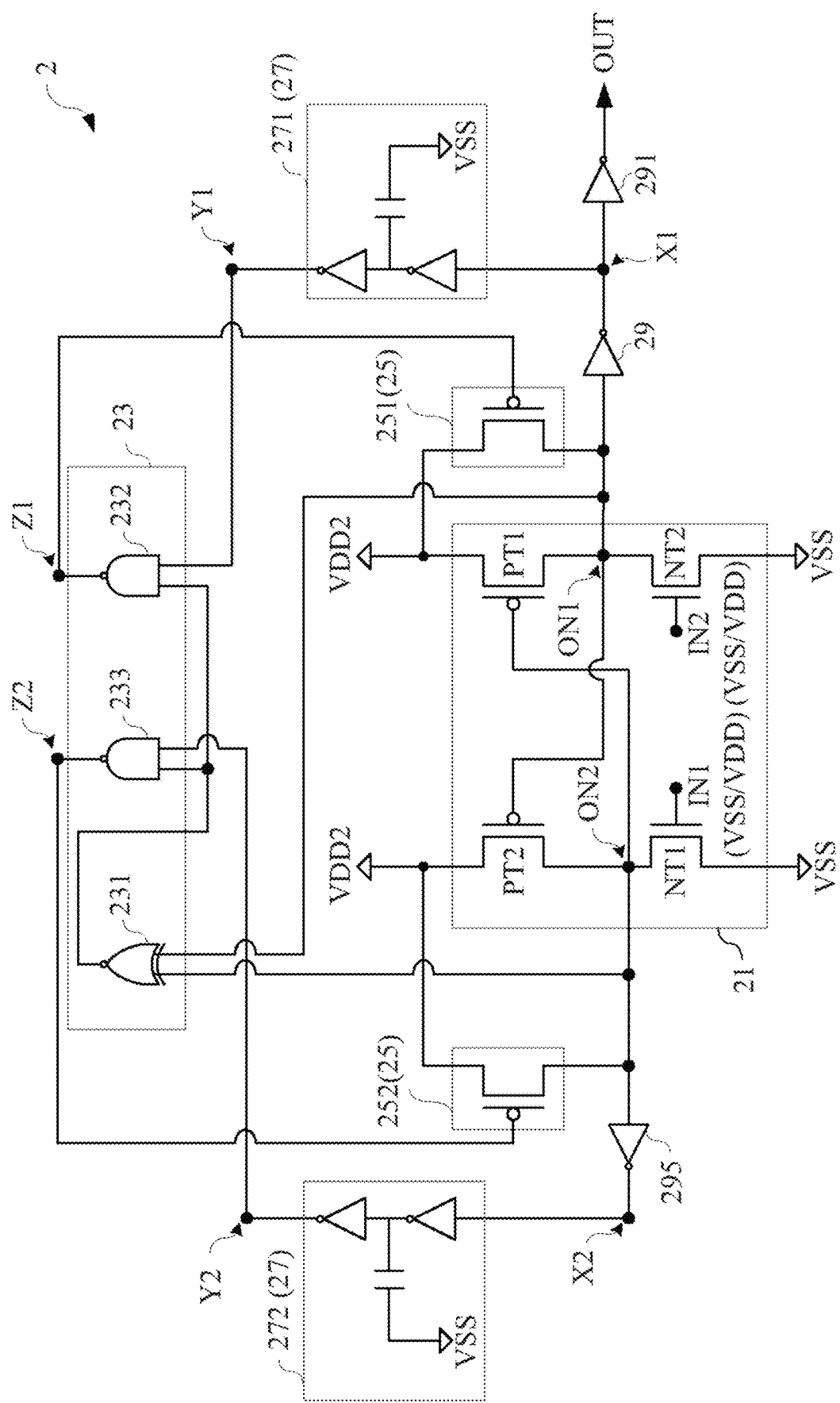
FIG. 2A illustrates a circuit diagram of the level shifting circuit shown in FIG. 1 according to one or more embodiments of the present invention.
Figure 2B:
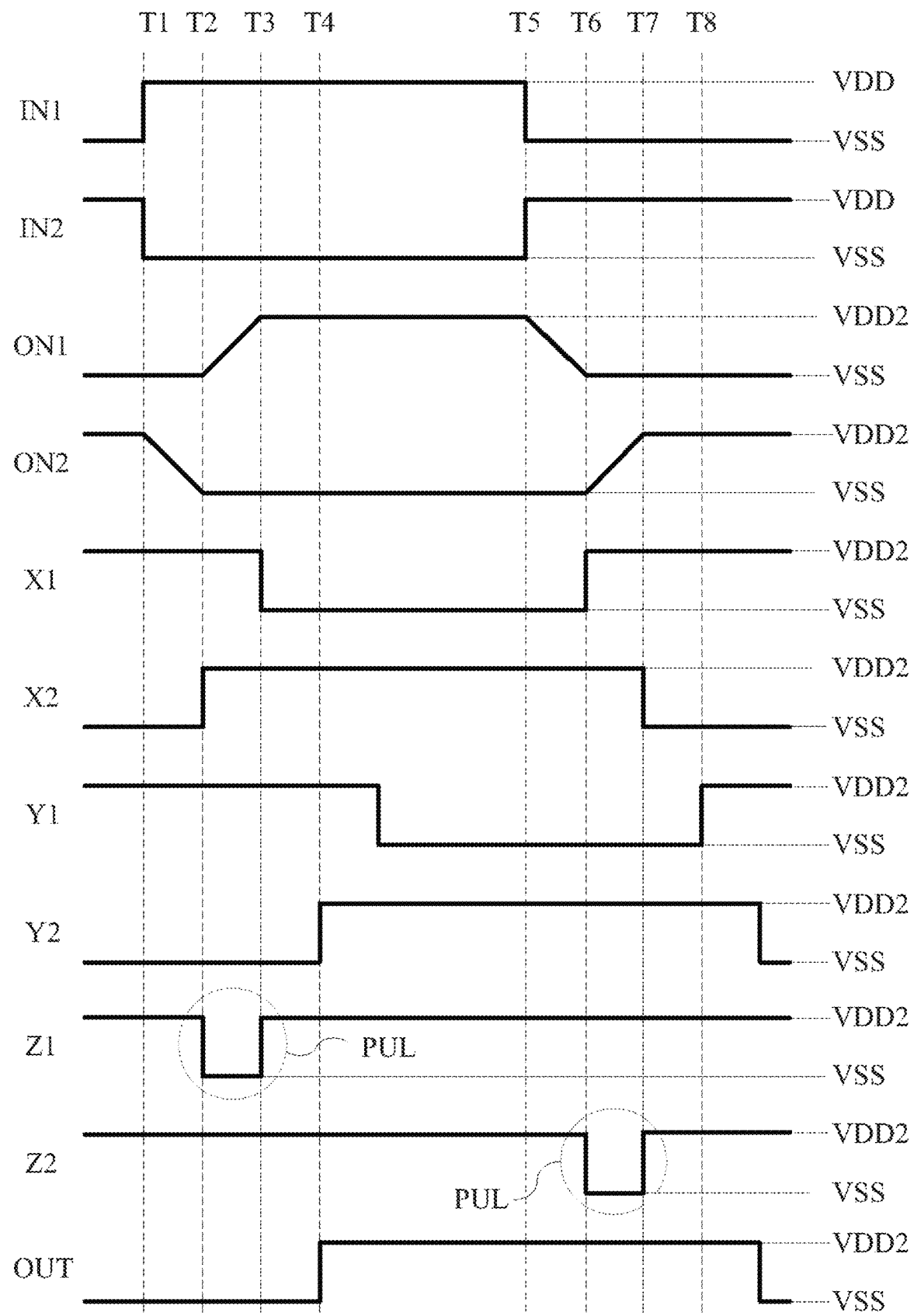
FIG. 2B illustrates a signal timing diagram of the level shifting circuit shown in FIG. 2A according to one or more embodiments of the present invention.

FIG. 2A illustrates a circuit diagram of the level shifting circuit 1 shown in FIG. 1 according to one or more embodiments of the present invention. FIG. 2B illustrates a signal timing diagram of the level shifting circuit 1 shown in FIG. 2A according to one or more embodiments of the present invention. The contents shown in FIG. 2A and FIG. 2B are merely for explaining the embodiments of the present invention instead of limiting the present invention.

Referring to FIG. 2A, the level shifter 21 may comprise a first PMOS transistor PT1, a second PMOS transistor PT2, a first NMOS transistor NT1 and a second NMOS transistor NT2. The source electrode of the PMOS transistor PT1 receives a power supply voltage VDD2 corresponding to a second high logic level. The drain electrode of the PMOS transistor PT1 is connected with a node "ON1". The gate electrode of the PMOS transistor PT1 is connected with a node "ON2". The source electrode of the PMOS transistor PT2 receives the power supply voltage VDD2. The drain electrode of the PMOS transistor PT2 is connected with the node "ON2". The gate electrode of the PMOS transistor PT2 is connected with the node "ON1". The drain electrode of the NMOS transistor NT1 is connected with the node "ON2". The source electrode of the NMOS transistor NT1 is connected with a ground voltage VSS. The gate electrode of the NMOS transistor NT1 receives an input signal IN1 which switches between a first high logic level (corresponding to a power supply voltage VDD1) and a low logic level (corresponding to the ground voltage VSS). The drain electrode of the NMOS transistor NT2 is connected with the node "ON1". The source electrode of the NMOS transistor NT2 is connected with the ground voltage VSS. The gate electrode of the NMOS transistor NT2 receives an inverted input signal IN2 (inverted IN1). The node "ON1" is served as a first output terminal to output the output signal OUT. In some embodiments, the node "ON2" is served as a second output terminal to output the inverted output signal (not shown).

The pull-up circuit 25 may comprise a first pull-up device 251 and a second pull-up device 252, each of which may be composed of at least one PMOS transistor. The source electrodes of the first pull-up device 251 and the second pull-up device 252 receive the power supply voltage VDD2. The drain electrode of the first pull-up device 251 is coupled with the first output node ON1, while the drain electrode of the second pull-up device 252 is coupled with the second output node ON2. The gate electrodes of the first pull-up device 251 and the second pull-up device 252 are coupled with the pulse generator 23 separately.

The pulse generator 23 may comprise an XNOR gate 231, a first NAND gate 232 and a second NAND gate 233. The XNOR gate 231 may comprise two input terminals coupled with the first output node ON1 and the second output node ON2 respectively and an output terminal. The first NAND gate 232 may comprise two input terminals and one output terminal, wherein one of the input terminals is coupled with the output terminal of the XNOR gate 231 and the other is arranged to receive an inverse signal of the output signal of the first output node ON1, and the output terminal is coupled with the gate electrode of the first pull-up device 251. The second NAND gate 233 may comprise two input terminals and one output terminal, wherein one of the input terminals is coupled with the output terminal of the XNOR gate 231 and the other is arranged to receive an inverse signal of the output signal of the second output node ON2, and the output terminal is coupled with the gate electrode of the second pull-up device 252.

The buffering device 29 may be an inverter whose input terminal is coupled with the first output node ON1 of the level shifter 21. There may be another inverter 291 whose input terminal is coupled with the output terminal of the buffering device 29 in series for coherent phase. Specifically, the output terminal of the inverter 291 may provide a signal OUT as the output signal of the level shifting circuit 1, and the output terminal of the buffering device 29 may provide the inverse signal of the output signal of the first output node ON1 to the input terminal of the first NAND gate 232. The buffering device 29 may improve the driving capability of the basic level shifter 21.

The delaying circuit 27 may comprise a first delaying device 271 and a second delaying device 272. Each of the first delaying device 271 and the second delaying device 273 may comprise two serially-coupled inverters and a capacitor. A terminal of each of the capacitors may be coupled with the connection node of the two inverters, and the other terminal may be coupled to the ground voltage VSS. The first delaying device 271 is coupled between the input terminal of the first NAND gate 232 and the output terminal of the first inverter 291 to delay the signal inputting into the pulse generator 23, while the second delaying device 272 is coupled between the input terminal of the second NAND gate 233 and the output terminal of an inverter 295 to delay the signal inputting into the pulse generator 23.

Referring to FIG. 2A and FIG. 2B together, at a time point T1, when the input signal IN1 is switched from the low logic level to the first high logic level, the first NMOS transistor NT1 is turned on and the output signal of the second output node ON2 is sharply pulled down to the low logic level, the first PMOS transistor PT1 is therefore turned on. At the same time, the inverted input signal IN2 is switched from the first high logic level to the low logic level and therefore the second NMOS transistor NT2 is turned off, the output signal of the first output node ON1 then starts being pull up to the second high logic level in a slower speed than the output signal of the second output node ON2 being pulling down. Thus, there is a moment or short period where both of the output signals of the first output node ON1 and the second output node ON2 present the low logic level.

At the time point T2, both of the output signals of the first output node ON1 and the second output node ON2 present the low logic level, and thus, the output signal of the XNOR gate 231 presents a second high logic level, which also acts as one of the two inputs of the first NAND gate 233 and the second NAND gate 235. The other input of the first NAND gate 233, i.e., the signal of the node Y1 (i.e., the output terminal of the first delaying device 271) will present the second high logic level. Therefore, the signal of the node Z1 will present the low logic level, in other words, the first NAND gate 233 in the pulse generator 23 generates a pulse signal PUL, which turns the first pull-up device 251 on. On the other hand, the other input of the second NAND gate 235, i.e., the signal of the node Y2, will present the low logic level despite the signal of the node X2 has changed from the low logic level to the second high logic level, since the delaying device 273 has delayed the signal change at the node Y2. Therefore, the signal of the node Z2 will present the second high logic level, and the second pull-up device 253 will remain disabled.

With the first pull-up device 251, the output signal of the first output node ON1 may be pulled up to the second high logic level (i.e., VDD2) at a time point T3. Since the output signal of the first output node ON1 has been pulled up to the second high logic level at the time point T3, the output signals of the first output node ON1 and the second output node ON2 presents complementary. Thus, the output of the XNOR gate 231 will be changed to the low logic level, and the signal of the node Z1 will therefore be changed to the second high logic level, causing the first pull-up device 251 to be disabled. In other words, the pull-up device 251 will be automatically shut down when finishing the level shifting.

In some embodiments, the delaying circuit 27 may be absent in the level shifting circuit 1. In this case, the signal of the node Y2 will change to the second high logic level at the time point T2, and the signal of the node Z2 will thus present the low logic level as the node Z1 does. Therefore, the first pull-up device 251 and the second pull-up device 252 will both be enabled (i.e., both of the first NAND gate 232 and the second NAND gate 233 generate a pulse signal PUL). The logic level of the output signal at the second output node ON2 will flip between the second high logic level and the low logic level until both logic levels at two output nodes present complementary, that is, the output signal of the first output node ON1 finally be pulled up to the second high logic level and the output signal of the second output node ON2 presents the low logic level.

In some embodiments, to make sure that only the first NAND gate 232 generates the pulse signal PUL, the delay period (e.g., the period between the time point T2 and the time point T4) should be equal to or longer than the pulse period of the pulse signal PUL (e.g., the period between the time point T2 and the time point T3).

At a time point T4, the output signal of the first output node ON1 has been pulled up to the second high logic level (i.e., the second voltage VDD2), and the output node OUT of the level shifting circuit 1 outputs the second high logic level.

Since the level shifting circuit 1 has a symmetric design, and the input signals received at the first input node IN1 and the second input node IN2 are inverse to each other at the same time, the details of how the signals of the nodes IN1, IN2, ON1, ON2, X1, X2, Y1, Y2, Z1, Z2 and OUT vary at time points T5, T6, T7 and T8 can be directly and easily understood by the people having ordinary skills in the art based on the above descriptions, and thus will not be further described herein.

Figure 3:
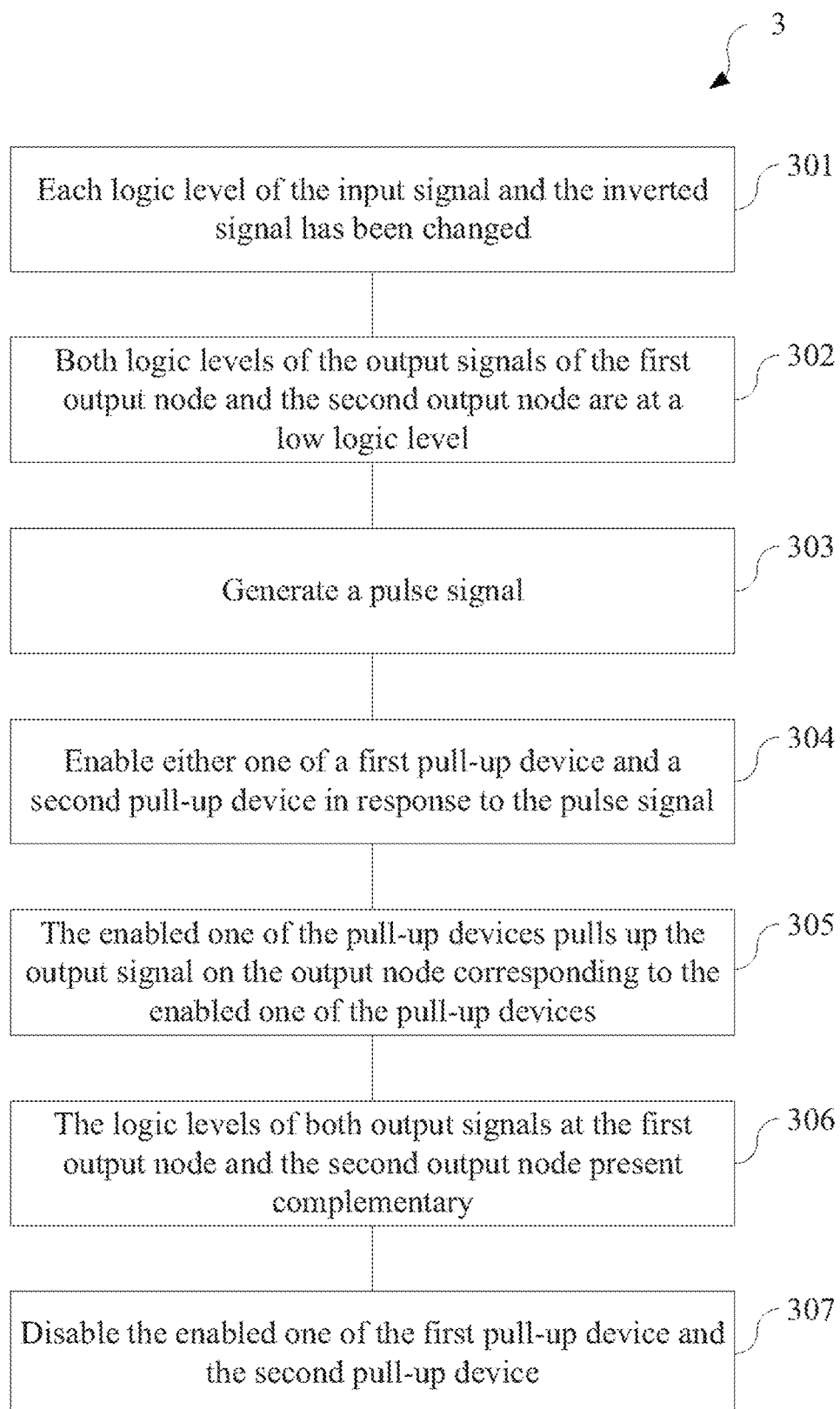
FIG. 3 illustrates schematic views of a method for operating a level shifter according to one or more embodiments of the present invention.

FIG. 3 illustrates schematic views of a method for operating a level shifter according to one or more embodiments of the present invention. The contents shown in FIG. 3 is merely for explaining the embodiments of the present invention instead of limiting the present invention.

Referring to FIG. 3, a method 3 for operating a level shifter is disclosed. The level shifter comprises a first input node for receiving an input signal, a second input node for receiving an inverted input signal and a first output node and a second output node for outputting signals that change between a second high logic level and a low logic level. In the method 3, when each logic level of the input signal and the inverted input signal has been changed (marked as a step 301) while both logic levels of the signals outputted from the first output node and the second output node are both at the low logic level (marked as a step 302), a pulse generator coupled with the level shifter may generate a pulse signal accordingly (marked as a step 303). In response to the pulse signal, either one of a first pull-up device and a second pull-up device may be enabled (marked as a step 304). Then, the enabled one of the first pull-up device and the second pull-up device coupled with the level shifter and the pulse generator may pull up the output signal on the output node corresponding to the enabled one of the first pull-up device and the second pull-up device to the second high logic level (marked as a step 305). When the logic level of both output signals at the first output node and the second output node present complementary (marked as a step 306), the first pull-up device and the second pull-up device may both be disabled (marked as a step 307).

The method 3 for operating a level shifter may be implemented with the level shifting circuit 1. Therefore, the embodiments of the method 3 for operating the level shifter can be directly and easily understood by people having ordinary skill in the art based on the aforesaid descriptions for the level shifting circuit 1, and will not be further described herein.

In summary, the level shifting circuit 1 and the method 3 for operating a level shifter are proposed to pull up either one of the output signals of the first output node and the second output node of the level shifter in a faster way when each logic level of the input signal and the inverted input signal has been changed. As a result, the unbalanced transition speed at the two sides of the level shifter can be effectively improved.

The above disclosure is related to the detailed technical contents and inventive features thereof. People having ordinary skill in the art may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A level shifting circuit, comprising:
   a level shifter, comprising:
      a first input node and a second input node for receiving complementary input signals that change between a first high logic level and a low logic level; and
      a first output node and a second output node for outputting complementary signals that change between a second high logic level and the low logic level;
   a pulse generator, coupled with the level shifter, and configured to generate a pulse signal when each logic level of the complementary input signals has been changed while both logic levels of the signals outputted from the first output node and the second output node are at the low logic level; and
   a pull-up circuit coupled with the level shifter and the pulse generator, comprising a first pull-up device and a second pull-up device;

wherein in response to the pulse signal, the first pull-up device and/or the second pull-up device are/is enabled, and the output signal on the output node corresponding to the enabled one of the first pull-up device and/or the second pull-up device are/is pulled up to the second high logic level; and wherein once the logic level of both output signals at the first output node and the second output node present complementary, the first pull-up device and the second pull-up device are disabled.

2. The level shifting circuit of claim 1, wherein:
the low logic level corresponds to a ground voltage;
the first high logic level corresponds to a first voltage; and
the second high logic level corresponds to a second voltage higher than the first voltage.

3. The level shifting circuit of claim 2, wherein the first pull-up device is coupled between the first output node and a second voltage source node configured for supplying the second voltage, and the second pull-up device is coupled between the second output node and the second voltage source node configured for supplying the second voltage.

4. The level shifting circuit of claim 1, wherein the pulse generator further comprises an XNOR gate, a first NAND gate and a second NAND gate.

5. The level shifting circuit of claim 1, wherein the first pull-up device is a PMOS transistor, and the second pull-up device is a PMOS transistor.

6. The level shifting circuit of claim 1, further comprising a delaying circuit comprising a first delaying device and a second delaying device coupled between the level shifter and the pulse generator for delaying timing of the output signals.

7. The level shifting circuit of claim 1, further comprising a buffering device coupled with the first output node of the level shifter.

8. A method for operating a level shifter, the level shifter comprising a first input node and a second input node for receiving complementary input signals that change between a first high logic level and a low logic level, and a first output node and a second output node for outputting complementary signals that change between a second high logic level and a low logic level, the method comprising:

generating a pulse signal by a pulse generator coupled with the level shifter when each logic level of the input signals has been changed while both logic levels of the signals outputted from the first output node and the second output node are at the low logic level, wherein in response to the pulse signal, either one of a first pull-up device and a second pull-up device is enabled; and pulling up the output signal on the output node corresponding to the enabled one of the first pull-up device and the second pull-up device to the second high logic level, wherein once the logic level of both output signals at the first output node and the second output node present complementary, the enabled one of the first pull-up device and the second pull-up device is disabled.

9. The method of claim 8, wherein:
the low logic level corresponds to a ground voltage;
the first high logic level corresponds to a first voltage; and
the second high logic level corresponds to a second voltage higher than the first voltage.

10. The method of claim 9, wherein the first pull-up device is coupled between the first output node and a second voltage source node configured for supplying the second voltage, and the second pull-up device is coupled between the second output node and the second voltage source node configured for supplying the second voltage.

11. The method of claim 8, wherein the timing of the output signals is delayed by a delaying circuit comprising a first delaying device and a second delaying device, wherein both of the first delaying device and the second delaying device are coupled between the level shifter and the pulse generator.

12. The method of claim 8, further comprising improving a driving capability of the level shifter by a buffering device coupled with the first output node of the level shifter.

* * * * *